(12) United States Patent
Kim

(10) Patent No.: US 6,939,757 B2
(45) Date of Patent: Sep. 6, 2005

(54) METHOD FOR FABRICATING MERGED LOGIC CMOS DEVICE

(75) Inventor: Seong-wook Kim, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/762,818

(22) Filed: Jan. 22, 2004

(65) Prior Publication Data

US 2004/0152273 A1 Aug. 5, 2004

(30) Foreign Application Priority Data

Jan. 27, 2003 (KR) ................................. 10-2003-0005142

(51) Int. Cl.⁷ .......................................... H01L 2/8238
(52) U.S. Cl. ..................................... 438/199; 438/257
(58) Field of Search ............................ 438/199, 217, 438/231, 238, 253, 257, 258

(56) References Cited

U.S. PATENT DOCUMENTS

| | | |
|---|---|---|
| 5,340,756 A | 8/1994 | Nagayasu |
| 5,565,369 A | 10/1996 | Ko |
| 5,702,988 A * | 12/1997 | Liang .......................... 438/238 |
| 6,071,775 A * | 6/2000 | Choi et al. ................... 438/257 |
| 6,512,273 B1 * | 1/2003 | Krivokapic et al. ........ 257/369 |

* cited by examiner

Primary Examiner—Phuc T. Dang
(74) Attorney, Agent, or Firm—Marshall, Gerstein & Borun LLP

(57) ABSTRACT

A method for fabricating a merged logic device is disclosed which simplifies the process by forming a deep junction of a double diffused drain (DDD) structure by a retrograded well ion implantation process. The method includes forming a high voltage p-type well region on a semiconductor substrate; simultaneously conducting an ion implantation for forming a logic p-type well region on a logic region and a high voltage n-type well region on the high voltage p-type well region; forming a high voltage gate oxide film on the entire surface and conducting a threshold voltage ion implantation process; forming a logic gate oxide film on the logic region and simultaneously forming a logic gate electrode and a high voltage gate electrode; forming a logic DDD region on the logic region and forming spacers on the sides of the gate electrodes; and forming logic source/drain regions, high voltage source/drain regions and a bulk bias control region.

6 Claims, 2 Drawing Sheets

METHOD FOR FABRICATING MERGED LOGIC CMOS DEVICE

TECHNICAL FIELD

A merged logic CMOS device is disclosed, and more particularly, a method for fabricating a merged logic CMOS device is disclosed which simplifies the process by forming a deep junction in a double diffused drain (DDD) structure using a retrograded well ion implantation process.

DESCRIPTION OF THE RELATED ART

Generally, in a high voltage external system that is controlled by an integrated circuit, the integrated circuit must require a device for controlling the high voltage. In addition, circuits in need of a high breakdown voltage also require a specific device for controlling the high voltage.

Examples of devices requiring such high voltage control include liquid crystal displays (LCD), devices for driving fluorescence indicator panels (FIP) or the like.

For an external system to which a high voltage is directly applied, in order to smoothly drive the external system with a driving transistor, the voltage should be greater than the breakdown voltage of the high voltage applied between the drain with the high voltage applied to the semiconductor substrate. Further, in order to increase the breakdown voltage, the concentration of impurities in the substrate should be lowered.

Thus, to obtain a high breakdown voltage, a double diffused drain (DDD) structure having the same conductive type lightly-doped region as a source and a drain is formed at a lower part of the source and drain regions. With such a structure, it is possible to obtain a high breakdown voltage as well as prevent a hot carrier effect.

Such a hot carrier effect is described as follows. A strong electric field is formed at a channel region around a drain as the length of the channel becomes smaller. As a result, a hot carrier with an accelerated high energy is trapped toward the gate generating a loss caused by leakage, and the gate oxide is damaged thereby decreasing the threshold voltage.

In a conventional high voltage device, a junction breakdown voltage of the high voltage device is determined according to the junction length or concentration of a source or drain, so the source/drain must be formed in a double diffused drain (DDD) structure. For this purpose, it is necessary to form a source/drain with a deep junction and a low concentration. This can be implemented by diffusion at a high temperature for an extended period of time.

However, the process of forming a conventional high voltage device has the following problems.

In the conventional art implementing a DDD structure of a high voltage device, since the diffusion is repeated, a low voltage driving has to be conducted. When implementing the DDD structure along with a CMOS logic device with a shallow junction structure, degradation of the characteristics of the logic device will result.

In order to design a process in such a way as to affect the logic device as little as possible, the number of process steps is greatly increased.

This leads to a problem in that productivity is lowered and manufacturing costs are increased.

SUMMARY OF THE DISCLOSURE

In consideration of the problems of the fabrication process of a merged logic device of the prior art, a method for fabricating a merged logic device is disclosed which simplifies the process by forming a deep junction of a double diffused drain (DDD) structure by a retrograded well ion implantation process upon forming a high voltage device.

A disclosed method for fabricating a merged logic device comprises: forming a high voltage p-type well region on a semiconductor substrate; conducting an ion implantation for forming a logic p-type well region on a logic region and a field stop ion implantation; forming a logic well region in the high voltage p-type well region; forming a high voltage gate oxide film on the entire surface and conducting a threshold voltage ion implantation process; forming a logic gate oxide film in the logic region and simultaneously forming a logic gate electrode and a high voltage gate electrode; forming a logic LDD region in the logic region and forming a spacer on the sides of the gate electrodes; and forming logic source/drain regions, high voltage source/drain regions and a bulk bias control region.

BRIEF DESCRIPTION OF THE DRAWINGS

Other aspects of the disclosed methods will become apparent from the following description with reference to the accompanying drawings, wherein.

DETAILED DESCRIPTION OF THE PRESENTLY PREFERRED EMBODIMENTS

Figure 1A:
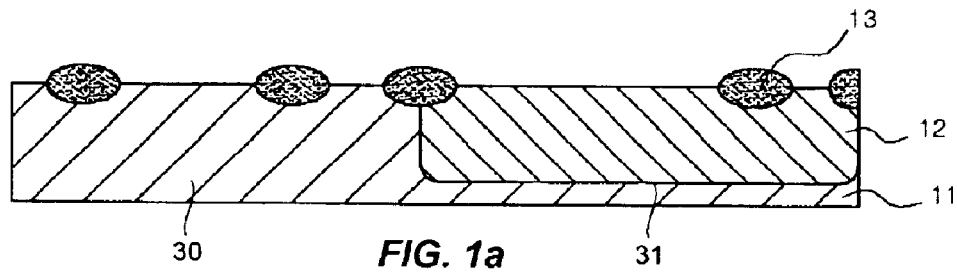
FIGS. 1a to 1f are cross sectional views showing the process of fabricating a merged logic device according to this disclosure.

Hereinafter, preferred embodiments will be described in greater detail while referring to the drawings.

FIGS. 1a to 1f are cross sectional views showing the process of fabricating a merged logic device according to this disclosure.

The disclosed methods permit a decrease in the number of process steps over conventional high voltage fabrication processes by simplification of the fabrication process. The disclosed methods also lower the degree of degradation of the characteristics of the logic device.

In a DDD structure of a source/drain of a prior art high voltage device, a heating cycle for implementing a deep junction is substituted for the retrograded well ion implantation process.

In contrast, by using the disclosed retrograded well ion implantation process, the number of process steps is decreased, and this process is superior from the viewpoint of throughput and efficiency.

Firstly, as shown in FIG. 1a, a device isolation layer 13 is formed on a semiconductor substrate 11 to define a logic region 30. Also, a high voltage p-type well region 12 is formed in the semiconductor substrate 11 to define a high voltage device-forming region 31.

Figure 1B:
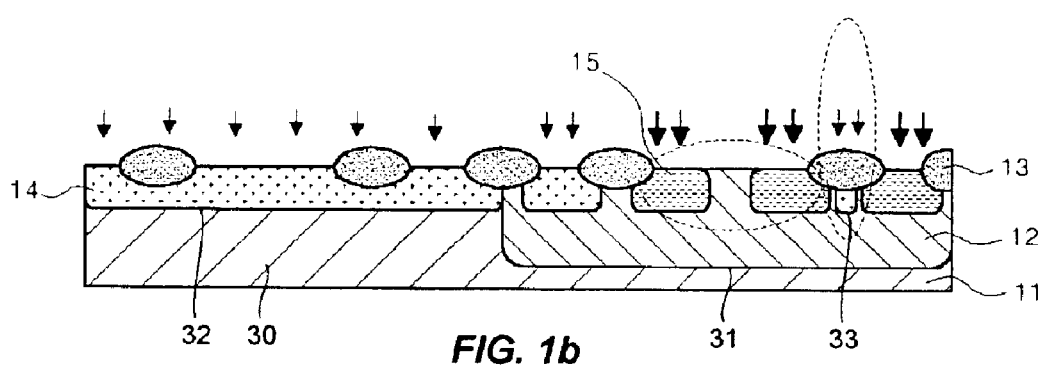

Simultaneously, as shown in FIG. 1b, a high voltage n-type well region 15 for forming source/drain regions of the high voltage device is formed on the high voltage p-type well region 12 while a logic p-type well region 14 formed on the logic region 30.

In this way, the logic well region 32 and the high voltage device forming region 31 is continuously formed with the formation of the logic p-type well region 14 and the high voltage n-type well region 15. A field stop layer 33 may also be formed at this time. Thus, a basic structure of the high voltage device formed without a high temperature diffusion process.

Figure 1C:
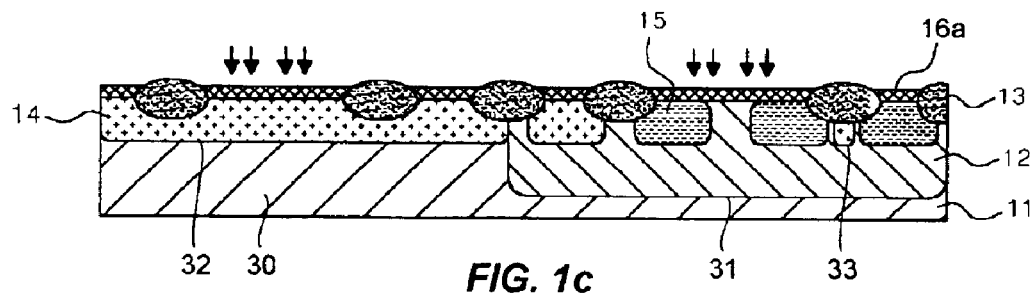

Further, as shown in FIG. 1c, a high voltage gate oxide film 16a is formed on the entire surface, and a threshold voltage ion implantation of the logic region 32 and a threshold voltage ion implantation of the high voltage device region 31 are conducted.

Figure 1D:
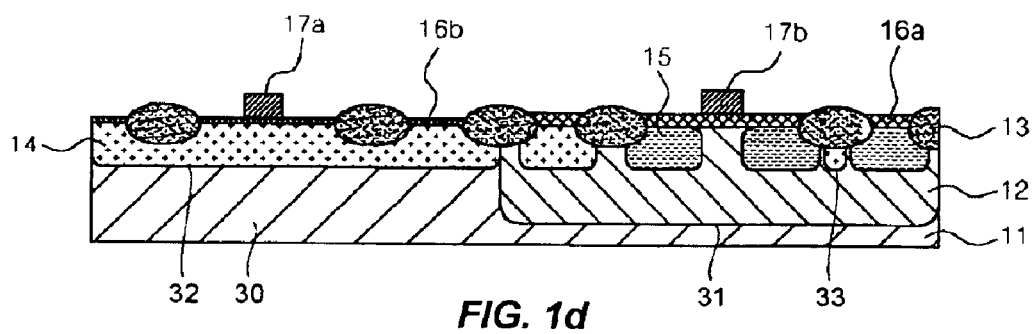

Next, as shown in FIG. 1d, by a wet etching process, the high voltage gate oxide film 16a of a logic region is removed and a logic gate oxide film 16b is formed.

And, a gate forming material layer is formed on the entire surface and selectively etched to form a logic gate electrode 17a and a high voltage gate electrode 17b.

Figure 1E:
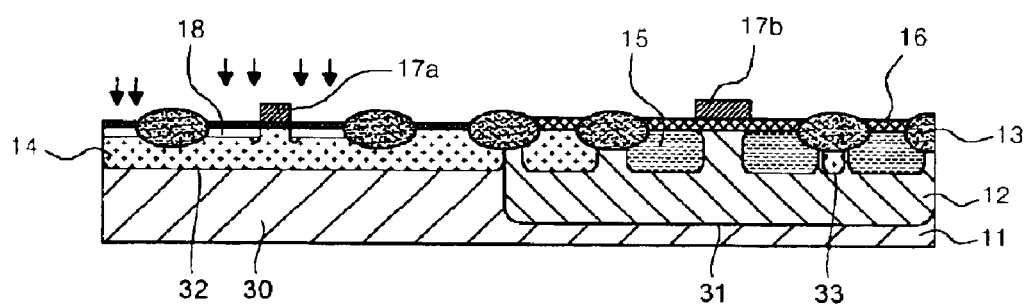

Next, as shown in FIG. 1e, lightly-doped n-type impurity ions are implanted into the logic region to form a logic DDD region 18.

Figure 1F:
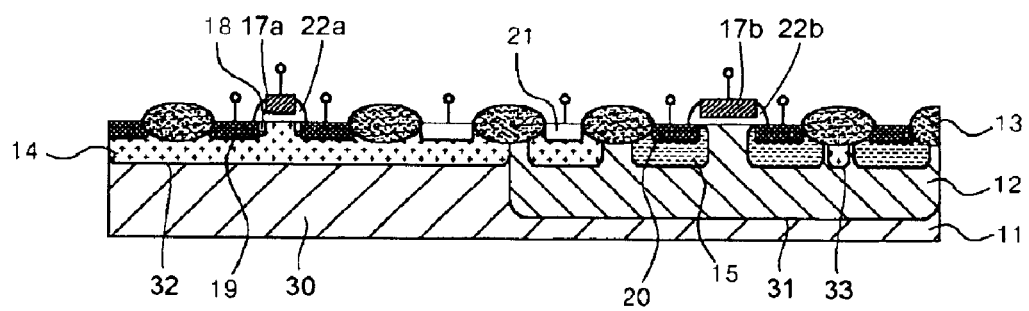

And, as shown in FIG. 1f, a spacer 22a is formed on the sides of the logic gate electrode 17a and a spacer 22b is formed of the high voltage gate electrode 17b, and logic source/drain regions 19, high voltage source/drain regions 20 and a bulk bias control region 21 are formed by an ion implantation process.

Hereto, although a method for fabricating a high voltage (HV) PMOS has been described, it is also possible to fabricate a NMOS transistor by the same method as this PMOS fabrication method.

According to the disclosed process, in the fabricating of a high voltage device employed for the applications of TFT LCD driver ICs, mobile phones, display (color STN, OLED) products and the like of which demand for is rapidly increasing, it is possible to reduce the fabrication cost and prevent the degradation of the characteristics of the logic device by employing the implementation method of a basic CMOS logic device.

The forgoing process is merely exemplary and is not to be construed as limiting this disclosure. The teachings can be readily applied to other types of apparatuses. The description of the disclosed process is intended to be illustrative, and not to limit the scope of the claims. Many alternatives, modifications, and variations will be apparent to those skilled in the art.

The method for fabricating a merged logic device according to the disclosed as described above has the following effects.

First, the stable characteristics of the logic device can be acquired by greatly reducing the number of steps of thermal diffusion required for implementing a high voltage transistor.

Second, since the number of process steps required for implementing the high voltage transistor is reduced, the process can be simplified, the fabrication costs lowered, and the throughput improved.

Third, it is possible to improve the shortage of a short channel margin caused by thermal diffusion on the sides of the high voltage source/drain by reducing diffusion.

What is claimed is:

1. A method for fabricating a merged logic device, comprising:
   forming a high voltage p-type well region and a logic region on a semiconductor substrate;
   simultaneously conducting an ion implantation for forming a logic p-type well region on the logic region and a high voltage n-type well region on the high voltage p-type well region;
   forming a high voltage gate oxide film on the resulting structure and conducting a threshold voltage ion implantation process;
   forming a logic gate oxide film on the logic region and forming a logic gate electrode on the logic region and a high voltage gate electrode on the high voltage p-type well region;
   forming a logic double diffused drain (DDD) region on the logic region and forming spacers on sides of the logic gate electrode and the high voltage gate electrode; and
   forming logic source/drain regions, high voltage source/drain regions and a bulk bias control region.

2. The method of claim 1, wherein a field stop layer is formed simultaneously with the formation of the logic p-type well region.

3. The method of claim 1, wherein a portion of the high voltage gate oxide film disposed over the logic region is removed by a wet etching process and a logic gate oxide film is formed over the logic region.

4. A method for fabricating the merged logic device comprising:
   forming a high voltage p-type well region and a logic region on a semiconductor substrate;
   conducting an ion implantation for forming a p-type well region on the logic region and a high voltage n-type well region on the high voltage p-type well region;
   forming a high voltage gate oxide film on the resulting structure;
   conducting a threshold voltage ion implantation process;
   forming a logic gate oxide film on the logic region;
   forming a logic gate electrode on the logic region and a high voltage gate electrode on the high voltage p-type well region;
   forming a logic DDD region on the logic region;
   forming spacers on side of the logic gate electrode and the high voltage gate electrode; and
   forming logic source/drain regions, high voltage source/drain regions and a bulk bias control region.

5. The method of claim 4 wherein a field stop layer is formed simultaneously with the formation of the logic p-type well region.

6. The method of claim 4 wherein a portion of the high voltage gate oxide film formed on the logic region is removed by a wet etching process and a logic gate oxide film is subsequently formed on the logic region.

* * * * *